(12) United States Patent
Tångring et al.

(10) Patent No.: US 9,711,699 B2
(45) Date of Patent: Jul. 18, 2017

(54) OPTOELECTRONIC SEMICONDUCTOR CHIP

(75) Inventors: Ivar Tångring, Regensburg (DE); Wolfgang Schmid, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 176 days.

(21) Appl. No.: 14/240,969

(22) PCT Filed: Jul. 6, 2012

(86) PCT No.: PCT/EP2012/063274
§ 371 (c)(1),
(2), (4) Date: Apr. 15, 2014

(87) PCT Pub. No.: WO2013/029847
PCT Pub. Date: Mar. 7, 2013

(65) Prior Publication Data
US 2014/0217460 A1    Aug. 7, 2014

(30) Foreign Application Priority Data

Aug. 30, 2011 (DE) .......................... 10 2011 111 919

(51) Int. Cl.
*H01L 33/62* (2010.01)
*H01L 33/14* (2010.01)
(Continued)

(52) U.S. Cl.
CPC ............ *H01L 33/62* (2013.01); *H01L 33/145* (2013.01); *H01L 33/20* (2013.01); *H01L 33/38* (2013.01);
(Continued)

(58) Field of Classification Search
CPC ................... H01L 33/38; H01L 33/145; H01L 2224/48463; H01L 33/405; H01L 33/62; H01L 33/20
See application file for complete search history.

(56) References Cited

U.S. PATENT DOCUMENTS

2003/0092210 A1  5/2003  Koide
2008/0230791 A1  9/2008  Lin et al.
(Continued)

FOREIGN PATENT DOCUMENTS

CN      102067334 A      5/2011
DE   102008024327 A1   11/2009
(Continued)

*Primary Examiner* — Latanya N Crawford
(74) *Attorney, Agent, or Firm* — Slater Matsil, LLP

(57) ABSTRACT

An optoelectronic semiconductor chip includes a semiconductor layer sequence having at least one active layer. Furthermore, the semiconductor chip has a top-side contact structure on a radiation main side of the semiconductor layer sequence and an underside contact structure on an underside situated opposite to the radiation main side. Furthermore, the semiconductor chip includes at last two trenches that extend from the radiation main side towards the underside. As seen in a plan view of the radiation main side, the top-side contact structure and the underside contact structure are arranged in a manner spaced apart from one another. Likewise as seen in a plan view of the radiation main side, the trenches are located between the top-side contact structure and the underside contact structure.

15 Claims, 5 Drawing Sheets

(51) Int. Cl.
  *H01L 33/20* (2010.01)
  *H01L 33/38* (2010.01)
  *H01L 33/40* (2010.01)

(52) U.S. Cl.
  CPC .. *H01L 33/405* (2013.01); *H01L 2224/48463* (2013.01)

(56) References Cited

U.S. PATENT DOCUMENTS

| | | |
|---|---|---|
| 2008/0237622 A1 | 10/2008 | Choi et al. |
| 2009/0179211 A1* | 7/2009 | Yoo .................. H01L 33/20 257/98 |
| 2010/0127397 A1 | 5/2010 | Chen et al. |
| 2011/0062487 A1 | 3/2011 | Oh |
| 2011/0198647 A1 | 8/2011 | Kazama |
| 2012/0261641 A1* | 10/2012 | Tanaka ............. 257/13 |
| 2012/0273753 A1* | 11/2012 | Tanaka ............. 257/13 |
| 2013/0146932 A1* | 6/2013 | McDaniel et al. ........ 257/99 |
| 2013/0187193 A1* | 7/2013 | Lopez et al. ........... 257/99 |

FOREIGN PATENT DOCUMENTS

| | | |
|---|---|---|
| DE | 102008063757 A1 | 11/2009 |
| DE | 102008048648 A1 | 4/2010 |
| WO | 2007008047 A1 | 1/2007 |

* cited by examiner

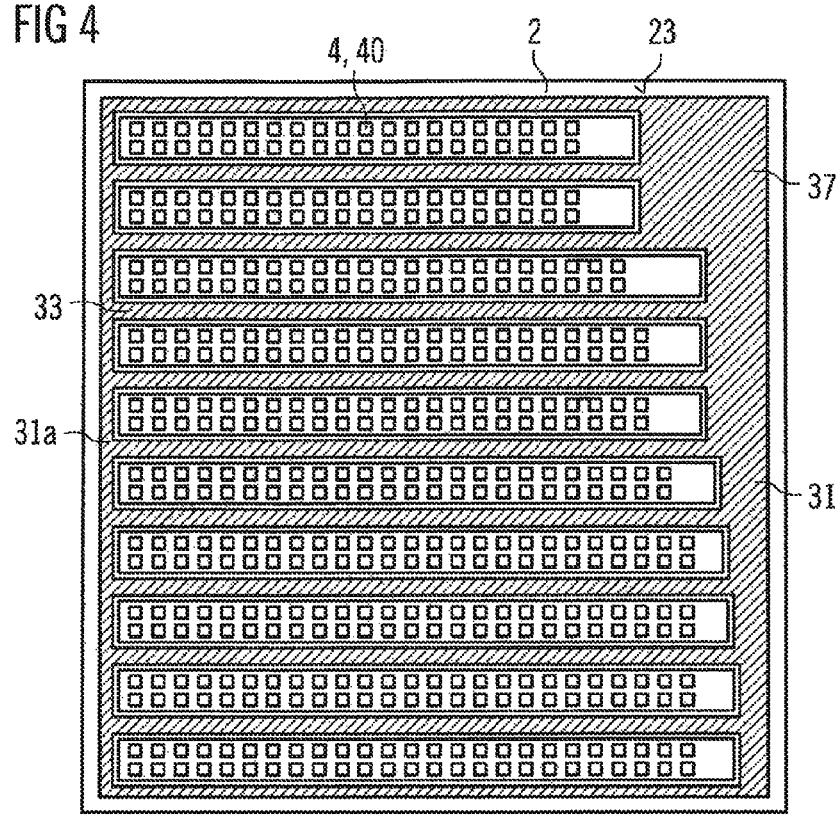
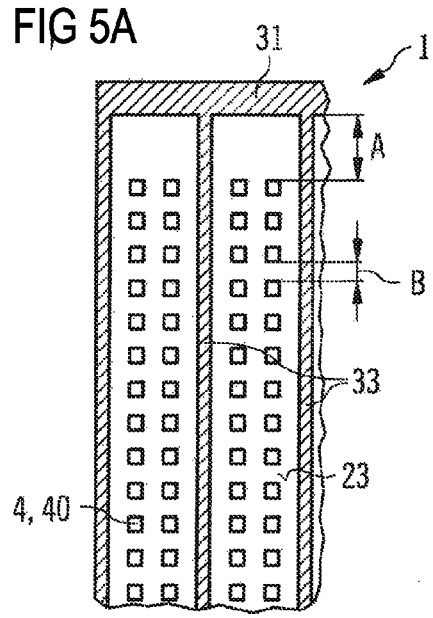
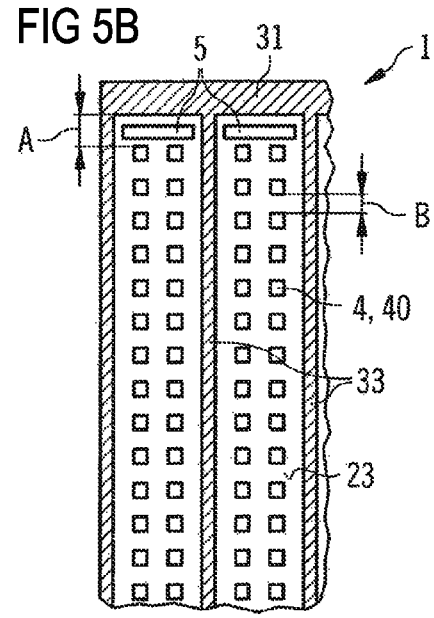

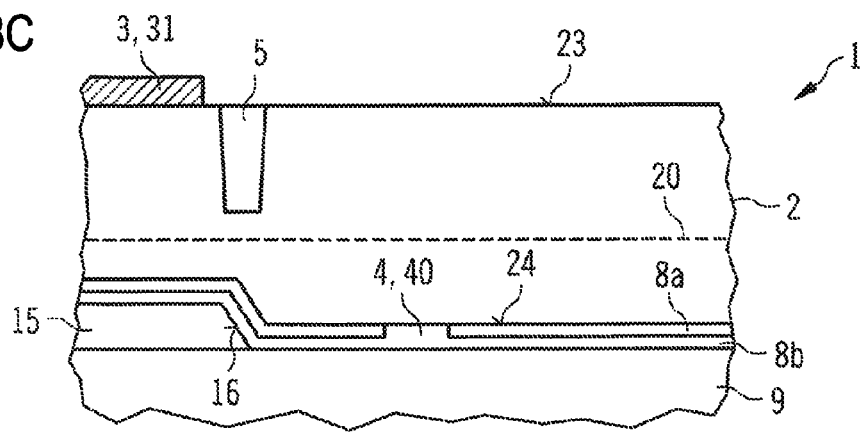
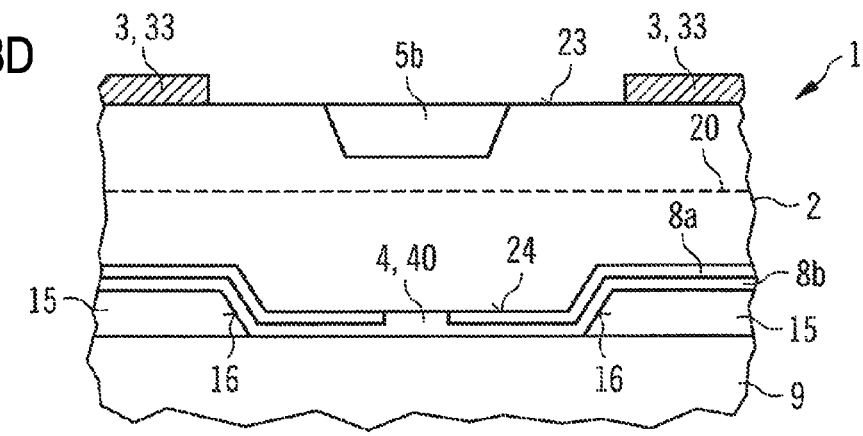
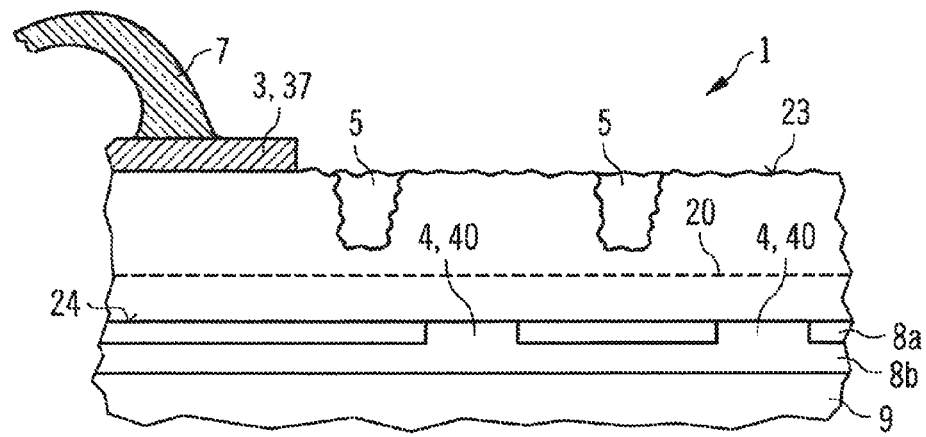

OPTOELECTRONIC SEMICONDUCTOR CHIP

This patent application is a national phase filing under section 371 of PCT/EP2012/063274, filed Jul. 6, 2012, which claims the priority of German patent application 10 2011 111 919.5, filed Aug. 30, 2011, each of which is incorporated herein by reference in its entirety.

TECHNICAL FIELD

An optoelectronic semiconductor chip is provided.

SUMMARY OF THE INVENTION

Embodiments of the invention provide an optoelectronic semiconductor chip which has a homogeneous current injection.

In accordance with at least one embodiment, the semiconductor chip comprises a semiconductor layer sequence having at least one active layer. The semiconductor layer sequence is arranged to emit, during operation of the semiconductor chip, ultraviolet radiation, visible radiation and/or infrared radiation, in particular in the spectral range between 400 nm and 1,200 nm inclusive, particularly preferably in the spectral range between 550 nm and 1,000 nm inclusive. A thickness of the semiconductor layer sequence, which can be grown epitaxially, is, e.g., less than 50 µm or less than 20 µm, preferably between 3 µm and 15 µm inclusive or between 3.5 µm and 10 µm inclusive.

The semiconductor layer sequence of the semiconductor chip is based preferably upon a III-V-compound semiconductor material. The semiconductor material is, e.g., a nitride compound semiconductor material such as $Al_n In_{1-n-m} Ga_m N$ or a phosphide compound semiconductor material such as $Al_n In_{1-n-m} Ga_m P$, where $0 \leq n \leq 1$, $0 \leq m \leq 1$ and $n+m \leq 1$. The semiconductor layer sequence can thereby have dopants and additional components. However, for the sake of simplicity, only the essential components of the crystal lattice of the semiconductor layer sequence, for instance Al, Ga, In, N or P are stated, even if they can be partially replaced and/or supplemented by small amounts of further substances. The active layer includes in particular a pn-transition and/or at least one quantum well structure.

In accordance with at least one embodiment, the semiconductor chip has a top-side contact structure. The top-side contact structure is attached to a radiation main side of the semiconductor layer sequence. Preferably, a material of the top-side contact structure is in direct physical contact with a material of the semiconductor layer sequence. The top-side contact structure is formed, e.g., from a metal or a metal alloy. Alternatively or in addition, the top-side contact structure can comprise a material from the group of transparent conductive oxides, TCO for short, e.g., ITO. The top-side contact structure is structured, that is to say the top-side contact structure does not extend in constant composition over the entire radiation main side of the semiconductor layer sequence but instead has in particular interruptions and cut-outs.

In a particularly preferable manner, the radiation main side of the semiconductor layer sequence is a boundary surface of the semiconductor layer sequence which is oriented substantially perpendicularly with respect to a growth direction of the semiconductor layer sequence. Main extension directions of the radiation main side can likewise be oriented perpendicularly with respect to the growth direction. Specifically, the radiation main side faces away from a carrier substrate of the semiconductor chip.

In accordance with at least one embodiment of the semiconductor chip, it comprises an underside contact structure. The underside contact structure is located on an underside of the semiconductor layer sequence, wherein the underside of the radiation main side lies opposite. In a particularly preferred manner, the underside contact structure is in direct physical contact with the semiconductor layer sequence and furthermore preferably does not cover the entire underside. A material of the underside contact structure is a metal or a metal alloy and alternatively or in addition a transparent conductive oxide. Preferably, the underside contact structure is located between the semiconductor layer sequence and a carrier substrate of the semiconductor chip.

In accordance with at least one embodiment of the semiconductor chip, it comprises at least one, preferably at least two, trenches. The trenches are material cut-outs in the semiconductor layer sequence which extend from the radiation main side in the direction towards the underside. Preferably, the trenches are surrounded completely, as seen in plan view, by a material of the semiconductor layer sequence. A longitudinal extension of the trenches is preferably at least five times the width of the trenches.

In accordance with at least one embodiment of the semiconductor chip, as seen in a plan view of the radiation main side, the top-side contact structure and the underside contact structure are spaced apart from one another in at least one region. That is to say, in a projection onto a plane in parallel with the radiation main side, the top-side contact structure and the underside contact structure do not overlap and/or contact one another in this region. In a particularly preferred manner, this region extends over the entire radiation main side and/or over the entire semiconductor chip.

In accordance with at least one embodiment, the trenches are arranged between the top-side contact structure and the underside contact structure in the region in which the underside contact structure and the top-side contact structure are spaced apart from one another. In other words, in the region at least one direct connection line from the top-side contact structure towards the underside contact structure is interrupted by the trench, as seen in a plan view of the radiation main side of the semiconductor layer sequence.

In at least one embodiment of the optoelectronic semiconductor chip, it comprises a semiconductor layer sequence having at least one active layer. Furthermore, the semiconductor chip has a top-side contact structure on a radiation main side of the semiconductor layer sequence and an underside contact structure on an underside of the semiconductor layer sequence situated opposite to the radiation main side. Furthermore, the semiconductor chip includes at least one, preferably at least two, trenches which extend from the radiation main side in the direction towards the underside. As seen in a plan view of the radiation main side, the top-side contact structure and the underside contact structure are arranged in a manner spaced apart from one another in at least one region of the radiation main side. As also seen in a plan view of the radiation main side, the trenches are located in this region and between the top-side contact structure and the underside contact structure.

In accordance with at least one embodiment of the optoelectronic semiconductor chip, it is designed as a light-emitting diode, LED for short. Then, on the radiation main side at least 50% or at least 70% of radiation which is emitted in total by the semiconductor chip and is generated in the active layer is preferably emitted.

In the case of light-emitting diodes, efficiency depends greatly upon current density. In general, efficiency of a light-emitting diode decreases when current densities are too high. Likewise, degradation of the light-emitting diode is accelerated in regions of excessive current density. Therefore, a homogeneous current injection is preferred, in order to achieve high efficiency and good ageing stability of the light-emitting diode.

This can be achieved by the trenches which, as seen in plan view, are located between the top-side contact structure and the underside contact structure. By virtue of the trenches, a direct current flow is prevented or significantly reduced locally between the top-side contact structure and the underside contact structure. Therefore, by means of suitable placement of the trenches it is possible to avoid local, excessive current densities in the semiconductor layer sequence.

In accordance with at least one embodiment of the semiconductor chip, the top-side contact structure comprises a contact region. The contact region is arranged for attaching a connection means, such as a bond wire or a conductor strip to the semiconductor chip. The contact region is e.g. a circular or rectangular contiguous surface with an area of at least 0.001 $mm^2$ or at least 0.01 $mm^2$. It is possible that in comparison with other portions of the top-side contact structure the contact region is provided with a coating which facilitates attachment of a bond wire.

In accordance with at least one embodiment of the semiconductor chip, the top-side contact structure has at least one intermediate connection. The intermediate connection extends preferably away from the contact region. It is possible that the top-side contact structure has a plurality of intermediate connections. In particular, the at least one intermediate connection is not provided for injecting current into the semiconductor layer sequence. That is to say, a direct current flow from the intermediate connection towards the underside contact structure is then prevented or significantly restricted by reason of the trenches.

In accordance with at least one embodiment of the semiconductor chip, the top-side contact structure includes one contact finger, or preferably a plurality of contact fingers. The contact fingers extend away from the intermediate connection and/or the contact region. The contact fingers are provided for injecting current into the semiconductor layer sequence. For example, the contact fingers are formed by means of long rectangles on the radiation main side. The contact fingers are distributed preferably uniformly over the radiation main side.

In accordance with at least one embodiment of the semiconductor chip, the trenches are each arranged along the intermediate connection. Thus, a direct current flow between the intermediate connection and the underside contact structure can be reduced or prevented.

In accordance with at least one embodiment of the semiconductor chip, the trenches are located between in each case two adjacent contact fingers. In particular, the trenches are oriented perpendicularly with respect to the contact fingers or substantially perpendicularly with respect thereto. In this case, it is possible for the trenches to contact the contact fingers and/or the intermediate connection. However, preferably there is an—albeit small—spacing between the trenches and the contact fingers and/or the intermediate connection, e.g., at least 250 nm.

In accordance with at least one embodiment of the semiconductor chip, the underside contact structure is formed by a plurality of islands. The islands are, e.g., rectangular or square in formation, as seen in a plan view of the radiation main side. Preferably, the individual islands are connected to one another in an electrically conductive manner by means of a contiguous contact layer which is located on a side of the underside contact structure facing away from the semiconductor layer sequence.

In accordance with at least one embodiment of the semiconductor chip, a plurality of the islands of the underside contact structure are located between two adjacent contact fingers. The islands are arranged along the contact fingers, e.g., in one or in two or in a plurality of rows. Preferably, the islands are placed equidistantly in the rows.

In accordance with at least one embodiment of the semiconductor chip, it has at least one further trench. The further trench is located on a side—facing away from the intermediate connection and/or the contact region—of the trenches described in the previous paragraphs. In other words, on the whole a plurality of trenches is then arranged in succession along the contact fingers, wherein these trenches extend preferably in each case between two adjacent contact fingers and in particular are oriented transversely with respect to these contact fingers. Preferably, a plurality of the islands of the underside contact structure are located between two adjacent trenches in the direction along the contact fingers.

In particular, in the case of semiconductor chips having comparatively large longitudinal extensions, it is possible that in a direction in parallel with the contact fingers and between adjacent contact fingers, a stimulated emission builds up, assisted by a comparatively high reflectivity of flanks of the semiconductor layer sequence. This stimulated emission leads to a generally undesired, increased emission at the flanks of the semiconductor layer sequence. This stimulated emission in the direction along the contact fingers can be reduced or suppressed by the additional trenches between adjacent contact fingers.

In accordance with at least one embodiment of the semiconductor chip, the trenches do not extend from the radiation main side as far as to the active layer. In other words, the active layer is not penetrated by the trenches. However, the trenches preferably extend into a current distribution layer of the semiconductor layer sequence, which is located between the active layer and the radiation main side, at least to such an extent that a transverse conductivity or a surface resistivity through the trenches is changed by at least a factor of 2. For example, as seen from the radiation main side, the trenches extend at least 25% or at least 50% or at least 65% of the way towards the active layer or towards the particular active layer located closest to the radiation main side.

In accordance with at least one embodiment of the semiconductor chip, it has at least one trench which extends along the contact fingers. For example, the trench is oriented in parallel with at least one of the contact fingers. Preferably, the trench is then located above the underside contact structure, as seen in a plan view of the radiation main side. By means of such a trench, a current density directly above the underside contact structure can be reduced. Since the underside contact structure has a comparatively low reflectivity for radiation, it is thereby possible overall to increase an efficiency of the semiconductor chip.

In accordance with at least one embodiment of the semiconductor chip, the trenches are oriented in an oblique manner with respect to the contact fingers and/or the intermediate connection. In other words, the trenches or at least some of the trenches are not aligned in parallel and are not aligned perpendicularly with respect to the contact fingers or the intermediate connection. An angle between at least one of the trenches and an adjacent contact finger and/or the adjacent intermediate connection is preferably greater than 2°, in particular greater than 4°. Alternatively or in addition, this angle is at the most 30° or at the most 20° or at the most 10°. As a result, it is possible to further reduce a stimulated emission along the contact fingers.

In accordance with at least one embodiment of the semiconductor chip, the trenches or at least one of the trenches, as seen from the radiation main side, penetrate(s) at least 90% or all of the semiconductor layer sequence.

In accordance with at least one embodiment of the semiconductor chip, as seen in a plan view of the radiation main side, the trenches occupy a proportion between 0.025% and 5% inclusive, in particular between 0.1% and 2.5% inclusive of a base area of the semiconductor layer sequence. In other words, the trenches make up only a small proportion in relation to the radiation main side.

In accordance with at least one embodiment of the semiconductor chip, as seen in a plan view of the radiation main side, a spacing between the trenches and the intermediate connection is at the most 8 μm or at the most 6 μm. Alternatively or in addition, the spacing is at least 0.5 μm or at least 1.5 μm. The said numerical values can also apply to a spacing between the trenches and the contact fingers.

In accordance with at least one embodiment of the semiconductor chip, the following relationship applies for a minimum spacing A between the underside contact structure and the intermediate connection and for an average spacing B between adjacent islands of the underside contact structure: $0.4 \leq A/B \leq 2.5$ or $0.9 \leq A/B \leq 1.5$ or $1.0 \leq A/B \leq 1.3$. The spacings A, B are determined in this case in a plan view of the radiation main side. In other words, the spacings A, B are approximately equal in size.

In accordance with at least one embodiment of the semiconductor chip, the radiation main side is provided with a surface roughening to improve light coupling-out efficiency of radiation from the semiconductor layer sequence. In this case, the surface roughening also extends into the trenches or into at least one of the trenches. In other words, boundary surfaces of the trenches are not smooth but also roughened. An average depth of the surface roughening is, e.g., between 0.1 μm and 3 μm inclusive. In a particularly preferred manner, an average structural size of the surface roughening is smaller than average dimensions of the trenches. Light coupling-out efficiency can be increased by virtue of a surface roughening also in the trenches.

In accordance with at least one embodiment of the semiconductor chip, a reflective layer is located on the underside of the semiconductor layer sequence. In a lateral direction, the reflective layer preferably adjoins the underside contact structure or the islands of the underside contact structure. The reflective layer can be a layer of a dielectric material having a comparatively small refractive index, e.g., a layer with a silicon oxide or with a silicon nitride. Located underneath this dielectric reflective layer can be a further reflective layer which is manufactured with a metal such as aluminum, gold or silver.

The further reflective layer can also be formed as a contact layer which electrically connects the islands of the underside contact structure with each other. It is also possible for the reflective layer to be formed as plurality of alternating partial layers having an alternating high and low refractive index and thus as a Bragg-mirror. Such mirrors are disclosed, e.g., in German patent publication no. DE 10 2008 048 648 A1, the disclosure content of which is hereby incorporated by reference.

In accordance with at least one embodiment of the semiconductor chip, it has one or a plurality of micro-prisms. The micro-prisms are located between the carrier substrate and the semiconductor layer sequence. As seen in plan view, the micro-prisms are preferably covered partially by the top-side contact structure. In a particularly preferred manner, a thickness of the micro-prisms is selected such that a transverse conductivity or a surface resistivity of the semiconductor layer sequence, in particular on a side facing towards the carrier substrate, is reduced by at least a factor of 2 by the micro-prisms.

BRIEF DESCRIPTION OF THE DRAWINGS

An optoelectronic semiconductor chip described in this case will be explained in greater detail hereinafter with reference to the drawing and with the aid of exemplary embodiments. Like reference numerals designate like elements in the individual figures. However, no references are illustrated to scale, rather, individual elements can be illustrated excessively large for a better understanding.

FIGS. 1 to 3, 5A to 7, and 9 show schematic plan views of exemplary embodiments of optoelectronic semiconductor chips described in this case;

FIG. 4 shows a schematic plan view of a light-emitting diode; and

FIG. 8A to 8D shows schematic sectional views of exemplary embodiments of optoelectronic semiconductor chips described in this case.

DETAILED DESCRIPTION OF ILLUSTRATIVE EMBODIMENTS

Figure 1:
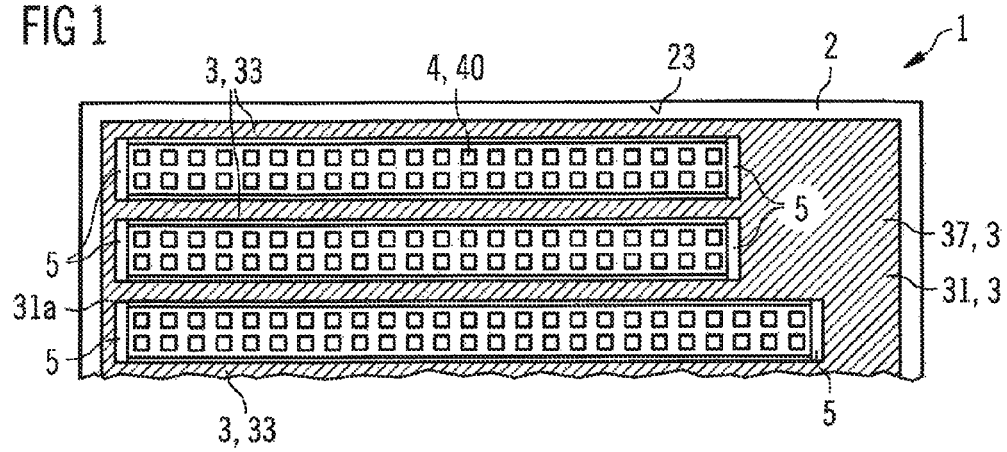

FIG. 1 illustrates a schematic plan view of an exemplary embodiment of an optoelectronic semiconductor chip 1. The semiconductor chip 1 includes a semiconductor layer sequence 2. Located on a radiation main side 23 of the semiconductor layer sequence 2 is a top-side contact structure 3 having a contact region 37, an intermediate connection 31 and having a plurality of contact fingers 33. The contact region 37 is located on a corner of the radiation main side 23 and is arranged for connection to a bond wire, not shown in FIG. 1.

The intermediate connection 31 extends away from the contact region 37. Extending in the direction away from the intermediate connection 31 and from the contact region 37 are the contact fingers 33 which are arranged for injecting current into the semiconductor layer sequence 2. A further intermediate connection 31a is optionally located on a side of the radiation main side 23 situated opposite to the intermediate connection 31, which means that the entire radiation main side 23 is surrounded in a frame-like manner by the outermost contact fingers 33 and the intermediate connections 31, 31a.

Furthermore, the semiconductor chip 1 has an underside contact structure 4 which is formed by a plurality of islands 40 on an underside 24 of the semiconductor layer sequence 2. The islands 40 of the underside contact structure 4 are arranged in two rows between and along the contact fingers 33. The underside contact structure 4 is located between the semiconductor layer sequence 2 and a carrier substrate, not shown in FIG. 1, which mechanically supports the semiconductor chip 1 and is preferably different from a growth substrate for the semiconductor layer sequence 2.

During operation of the semiconductor chip 1, a current flows from the contact fingers 33, which are preferably located on an n-side of the semiconductor layer sequence 2, towards the islands 40 of the underside contact structure 4 which is located in particular on a p-side of the semiconductor layer sequence 2. A current density of a current from the contact fingers 33 towards the islands 40 is comparatively homogeneous.

In order to prevent current density peaks close to the intermediate connections 31, 31a, a plurality of trenches 5 are located along the intermediate connections 31, 31a. The trenches 5 are located in each case on ends of the contact fingers 33 and extend in each case between two adjacent contact fingers 33. Therefore, the trenches 5 are provided between the intermediate connections 31, 31a and the contact region 37 and the underside contact structure 4, as seen in a plan view of the semiconductor layer sequence 2. As a result, a direct current flow from the intermediate connections 31, 31a and the contact region 37 towards the islands 40 is prevented or significantly reduced.

Figure 2:
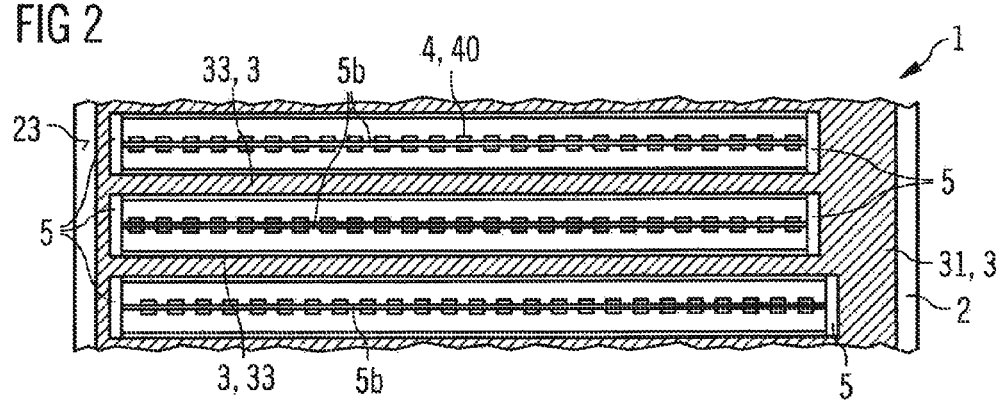

FIG. 2 illustrates a section of the radiation main side 23 of a further exemplary embodiment of the semiconductor chip 1. Formed in the semiconductor layer sequence 2 are additional trenches 5b which extend along the entire contact fingers 33 and are located centrally between two adjacent contact fingers 33. Furthermore, as seen in plan view, the trenches 5b are placed above the islands 40 of the underside contact structure 4.

The additional trenches 5b ensure that no or only comparatively little radiation is generated in the semiconductor layer sequence 2 directly above the island 40. As a result, proportionately less of the radiation generated overall in the semiconductor layer sequence 2 impinges upon the underside contact structure 4 which is formed in particular from a metallic material which absorbs radiation to a comparatively large extent. Therefore, the additional trenches 5b can reduce efficiency losses caused by radiation absorption on the underside contact structure 4.

Figure 3:
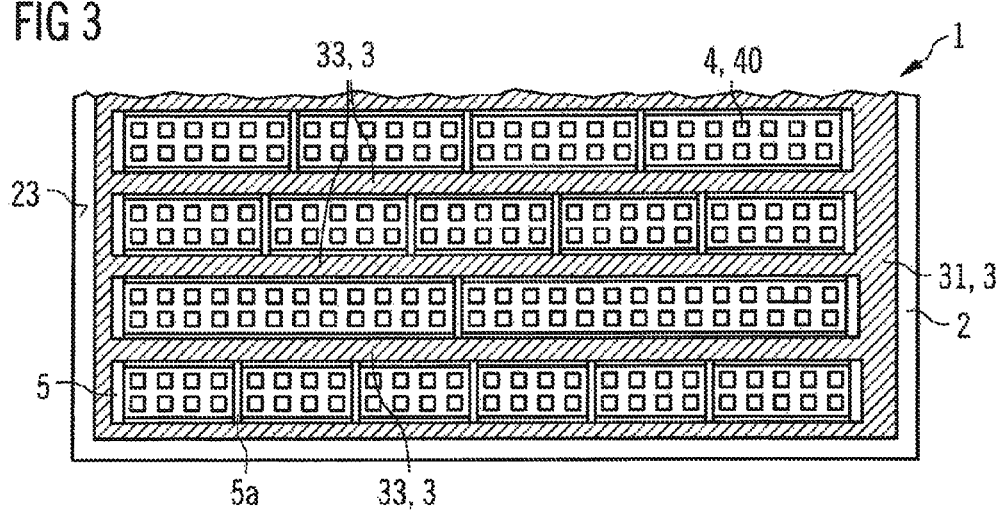

In the case of the exemplary embodiment of the semiconductor chip 1 as shown in FIG. 3, see the plan view of a section of the radiation main side 23, further trenches 5a are formed along and perpendicularly with respect to the contact fingers 33, which further trenches do not directly adjoin the intermediate connections 31, 31a or the contact region, not shown in FIG. 3. By virtue of these further trenches 5a, a stimulated emission in the direction in parallel with the contact fingers 33 can be suppressed.

The further trenches 5a or the additional trenches 5b in FIGS. 2 and 3 can have smaller widths and/or different depths than the trenches 5 directly at the intermediate connections 31, 31a or directly at the contact region 37. It is also possible that, unlike the illustration in FIG. 2, the trenches 5a, 5b do not extend completely along the contact fingers 33 or, in the case of the exemplary embodiment as shown in FIG. 3, the further trenches 5a in the direction transverse with respect to the contact fingers 33 are shorter than the trenches 5 at the ends of the contact fingers 33.

FIG. 4 illustrates a plan view of a light-emitting diode. Also, as in all of the exemplary embodiments of the semiconductor chip 1, it is possible that the intermediate connection 31 narrows in the direction away from the contact region 37, in order to ensure a uniform supply of current to the individual contact fingers 33.

FIG. 5A shows a plan view of a light-emitting diode, similar to that shown in FIG. 4, and FIG. 5B shows a plan view of an exemplary embodiment of a semiconductor chip 1, similar to that shown in FIG. 1. The islands 40 of the underside contact structure 4 are at a spacing A from the intermediate connection 31. An average spacing between two adjacent islands 40 of the underside contact structure 4, in particular in a direction in parallel with the contact fingers 33, is designated by the letter "B".

Since the trenches 5 prevent a direct current flow from the intermediate connection 31 to the islands 40, the spacing A can be reduced considerably in comparison with a light-emitting diode without such trenches. As shown in FIG. 5B, the spacings A, B are approximately equal. By reducing the spacing A in FIG. 5B, in comparison with FIG. 5A, it is possible to achieve an overall larger light-emitting surface of the radiation main side 23, whereby an efficiency of the semiconductor chip 1 can be increased.

Figure 6:
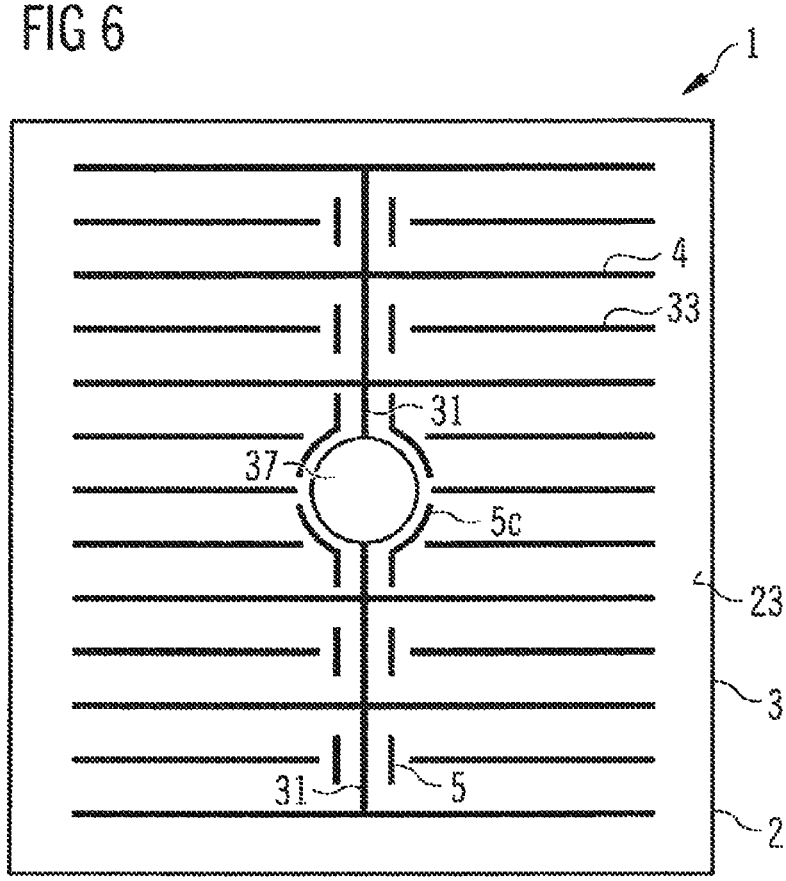

In the case of the exemplary embodiment shown in FIG. 6, the contact region 37 which is circular in formation is located centrally above the semiconductor layer sequence 2. Starting from the contact region 37, two intermediate connections 31 extend over the semiconductor layer sequence 2. The trenches 5c directly at the contact region 37 follow a contour of the contact region 37.

Also, as in all of the exemplary embodiments it is possible that the underside contact structure 4 is not formed in the manner of an island but rather in the manner of a strip, as in FIG. 6. In contrast to the illustrations in the figures, it is also possible in all of the exemplary embodiments that a plurality of contact regions 37 are attached to the radiation main side 23, either at corners, centrally on longitudinal sides or inside the radiation main side 23.

Figure 7:
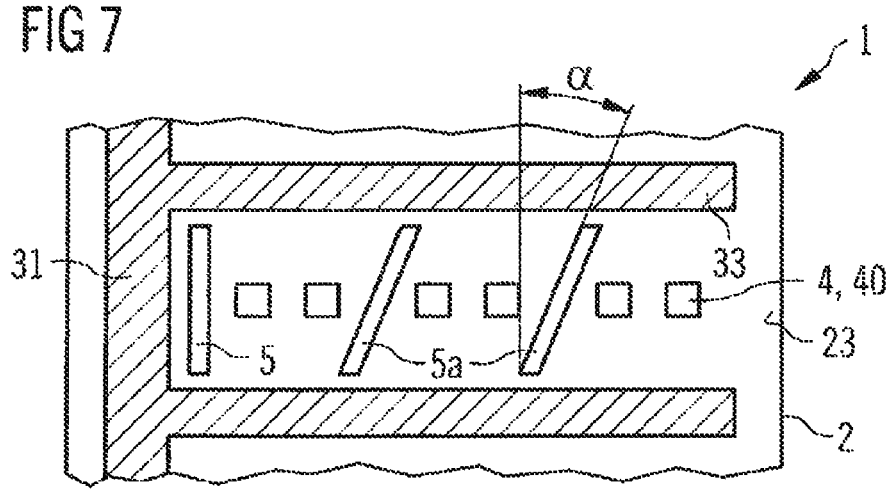

FIG. 7 shows a further exemplary embodiment of the semiconductor chip 1. As shown in FIG. 7, the trenches 5a which are not located directly at the intermediate connection 31 are arranged obliquely with respect to the contact fingers 33 and are at an angle α with respect to the contact fingers 33. As a result, a stimulated emission in the direction in parallel with the contact fingers 33 can be further suppressed. Unlike in FIG. 7, it is also possible that the trench 5 located directly at the intermediate connection 31 is also obliquely oriented, like the trenches 5a.

Figure 8A:
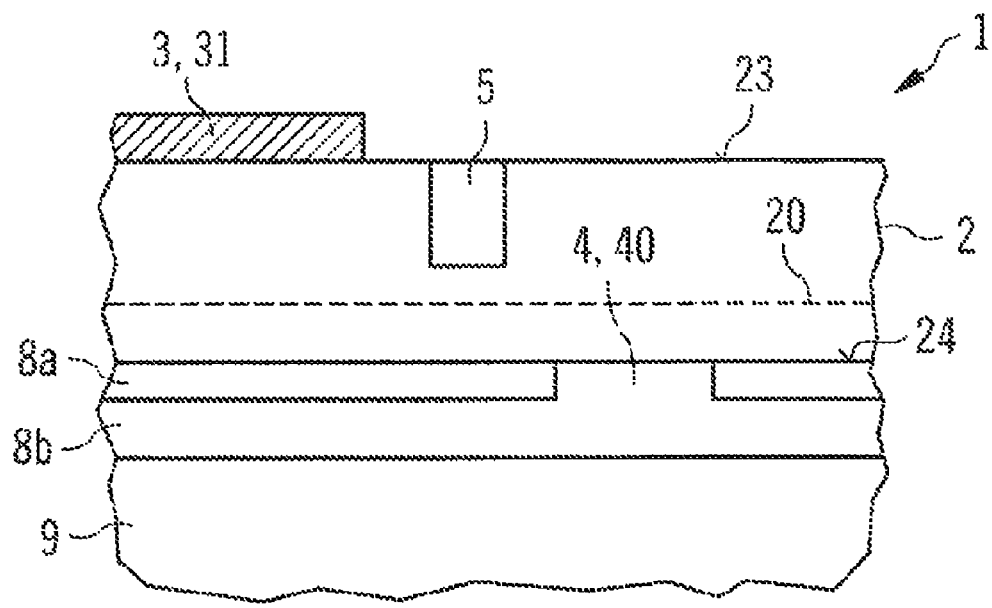

FIG. 8 illustrates sectional views of exemplary embodiments of the semiconductor chip 1. As shown in FIG. 8A, the trench 5 does not extend from the radiation main side 23 to an active layer 20 of the semiconductor layer sequence 2. By means of the trench 5, a transverse conductivity of the semiconductor layer sequence 2 in the region between the active layer 20 and the radiation main side 23 is reduced preferably by at least a factor of 2, in relation in particular to a current flow from the intermediate connection 31 towards the island 40.

In a lateral direction, the island 40 is surrounded by a reflective layer 8a, preferably consisting of a dielectric material having a refractive index which is low in comparison with the semiconductor layer sequence 2. Towards the carrier substrate 9 of the semiconductor chip 1, the dielectric reflective layer 8a is followed by an electrically conductive, preferably metallic reflective layer 8b. The reflective layer 8b also electrically connects together, e.g., the individual islands 40 of the underside contact structure 4.

Figure 8B:
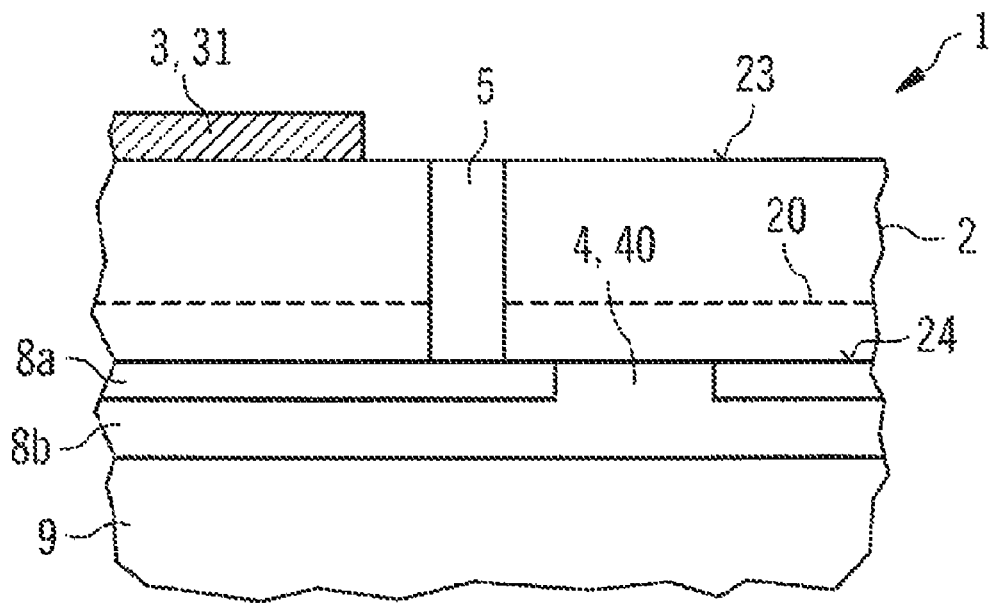

As shown in FIG. 8B, the trench 5 extends from the radiation main side 23 as far as to an underside 24 of the semiconductor layer sequence 2. The semiconductor layer sequence 2 is thus penetrated completely by the trench 5. Unlike the illustration in FIG. 8B, it is also possible that although the trench 5 penetrates the active layer 20, it does not extend as far as to the underside 24.

FIG. 8C shows a sectional view of a further exemplary embodiment of the semiconductor chip 1. The semiconductor chip 1 comprises at least one micro-prism 15 which is located between the carrier substrate 9 and the semiconductor layer sequence 2. The micro-prism or the plurality of micro-prisms 15 is preferably completely covered by the reflective layers 8a, 8b.

The micro-prisms 15 also preferably extend completely between the intermediate connection 31 and/or the contact region, not shown in FIG. 8C, as seen in plan view. In a particularly preferred manner, the micro-prisms 15 extend in a lateral direction and away from the intermediate connection 31 and/or the contact region at least as far as under the trenches 5. As seen in plan view, a flank 16 of the micro-prisms 15 is located, e.g., under the trench 5. In this case, the flank 16 is a boundary surface of the micro-prism 15 in a lateral direction.

A thickness of the micro-prisms 15, in a direction away from the carrier substrate 9, is preferably at least 100 nm or at least 250 nm. For example, the thickness is between inclusive 0.5 μm and 4 μm. A thickness of the reflective layers 8a, 8b is preferably approximately constant over the entire semiconductor layer sequence 2, with an exception in the region of the underside contact structure 4 with the islands 40.

A main side of the carrier substrate 9 facing towards the semiconductor layer sequence 2 is preferably formed in a planar manner. The micro-prisms 15 are formed, e.g., partially or completely by means of a metal or a metal alloy. It is also possible that the micro-prisms 15 have cavities which are evacuated or filled with gas.

The sectional view of FIG. 8D shows a semiconductor chip 1 with an additional trench 5b, see, e.g., in particular the exemplary embodiment as shown in FIG. 2. As seen in plan view, the additional trench 5b completely covers the islands 40 of the underside contact structure 4. The micro-prisms 15 do not extend as far as under the additional trench 5b.

Such micro-prisms, as illustrated in FIGS. 8C and/or 8D, can also be present in all of the other exemplary embodiments. In a preferred manner, a transversely conductive layer of the semiconductor layer sequence 2 is locally thinned or removed by means of the micro-prisms 15. This enables that a current flow in a lateral direction in the region of the micro-prisms 15, in particular under the contact fingers 33 and between the active layer 20 and the reflective layers 8a, 8b is reduced.

In the sectional view of the semiconductor chip 1 as shown in FIG. 9, the radiation main side 23 is provided, in regions in which the top-side contact structure 3 is not applied, with a surface roughening which can also be present in all of the other exemplary embodiments. The surface roughening has a smaller average structural size than the trenches 5. Furthermore, the surface roughening also extends into the trenches 5. The boundary surfaces of the trenches 5 are thus also provided with the surface roughening.

The invention described in this case is not limited by the description using the exemplary embodiments. Rather, the invention includes any new feature and any combination of features what includes in particular any combination of features in the claims, even if this feature or this combination itself is not explicitly stated in the claims or exemplary embodiments.

The invention claimed is:

1. An optoelectronic semiconductor chip comprising:
a semiconductor layer sequence having an active layer;
a top-side contact structure on a radiation main side of the semiconductor layer sequence;
an underside contact structure on an underside of the semiconductor layer sequence opposite to the radiation main side, wherein, as seen in a plan view of the radiation main side, the top-side contact structure and the underside contact structure are spaced apart from one another in at least one region such that in a projection onto a plane in parallel with the radiation main side, the top-side contact structure and the underside contact structure do not overlap and/or contact one another in the at least one region; and
a plurality of trenches extending from the radiation main side in a direction towards the underside, wherein the trenches in the at least one region are arranged between the top-side contact structure and the underside contact structure, and wherein the underside contact structure is formed by a plurality of islands located between contact fingers.

2. The optoelectronic semiconductor chip according to claim 1, wherein the top-side contact structure comprises:
a contact region for attaching a bond wire;
an intermediate connection extending away from the contact region and being not provided for injecting current into the semiconductor layer sequence; and
a plurality of contact fingers extending away from the intermediate connection and is provided for injecting current into the semiconductor layer sequence, and
wherein, in each case, the trenches extend along the intermediate connection and are located between two adjacent contact fingers.

3. The optoelectronic semiconductor chip according to claim 2,
wherein the trenches extend into a current distribution layer of the semiconductor layer sequence, and
wherein the current distribution layer is located between the active layer and the radiation main side and, as seen from the radiation main side, the trenches penetrate at least 65% of the current distribution layer.

4. The optoelectronic semiconductor chip according to claim 2, wherein the trenches do not extend from the radiation main side to the active layer.

5. The optoelectronic semiconductor chip according to claim 1, wherein a plurality of the islands is arranged along each contact finger.

6. The optoelectronic semiconductor chip according to claim 2,
wherein at least one of the trenches is located between the intermediate connection and a further one of the trenches, and
wherein the further one of the trenches extends from one of the contact fingers to a contact finger adjacent thereto.

7. The optoelectronic semiconductor chip according to claim 2, wherein, as seen in a plan view of the radiation main side, an angle α is between a trench and an adjacent contact finger, wherein $2° \leq \alpha \leq 30°$.

8. The optoelectronic semiconductor chip according to claim 1, wherein a trench extends along a contact finger.

9. The optoelectronic semiconductor chip according to claim 1, wherein, as seen in a plan view of the radiation main side, a trench is located above the underside contact structure.

10. The optoelectronic semiconductor chip according to claim 1, wherein the trenches penetrate at least 90% of the semiconductor layer sequence.

11. The optoelectronic semiconductor chip according to claim 1, wherein, as seen in a plan view of the radiation main side, the trenches occupy a proportion between inclusive 0.025% and 5% of a base area of the semiconductor layer sequence.

12. The optoelectronic semiconductor chip according to claim 1, wherein, as seen in a plan view of the radiation main side, a spacing between the trenches and an intermediate connection is at most 8 μm.

13. The optoelectronic semiconductor chip according to claim 1, wherein a minimum spacing A is between the underside contact structure and an intermediate connection and an average spacing B is between islands of the underside contact structure, and wherein $0.4 \leq A/B \leq 2.5$.

14. The optoelectronic semiconductor chip according to claim 1, wherein the radiation main side is provided with a surface roughening to improve coupling-out of light from the semiconductor layer sequence, and wherein the surface roughening extends into the trenches.

15. An optoelectronic semiconductor chip comprising:
a semiconductor layer sequence having an active layer;
a top-side contact structure on a radiation main side of the semiconductor layer sequence;
an underside contact structure on an underside of the semiconductor layer sequence opposite to the radiation main side; and
a plurality of trenches that extend from the radiation main side in a direction towards the underside,
wherein, as seen in a plan view of the radiation main side, the top-side contact structure and the underside contact structure are spaced apart from one another in at least one region of the radiation main side and the trenches in the at least one region are arranged between the top-side contact structure and the underside contact structure,
wherein the top-side contact structure has a contact region for attaching a bond wire, an intermediate connection that extends away from the contact region and is not provided for injecting current into the semiconductor layer sequence, and a plurality of contact fingers that extend away from the intermediate connection and is provided for injecting current into the semiconductor layer sequence,
wherein, in each case, the trenches extend along the intermediate connection and are located between two adjacent contact fingers, and
wherein the intermediate connection narrows in a direction away from the contact region.

* * * * *